(12) United States Patent
Goitsuka

(10) Patent No.: US 12,052,821 B2
(45) Date of Patent: Jul. 30, 2024

(54) STACKED-LAYER BOARD, ELECTRONIC COMPONENT MODULE, AND METHOD OF MANUFACTURING STACKED-LAYER BOARD

(71) Applicant: Murata Manufacturing Co., Ltd., Nagaokakyo (JP)

(72) Inventor: Takuya Goitsuka, Nagaokakyo (JP)

(73) Assignee: MURATA MANUFACTURING CO., LTD., Kyoto-fu (JP)

(*) Notice: Subject to any disclaimer, the term of this patent is extended or adjusted under 35 U.S.C. 154(b) by 4 days.

(21) Appl. No.: 17/652,104

(22) Filed: Feb. 23, 2022

(65) Prior Publication Data

US 2022/0183156 A1    Jun. 9, 2022

Related U.S. Application Data

(63) Continuation of application No. PCT/JP2020/039087, filed on Oct. 16, 2020.

(30) Foreign Application Priority Data

Oct. 30, 2019 (JP) ................................ 2019-196871

(51) Int. Cl.
*H05K 1/11* (2006.01)
*H05K 3/46* (2006.01)

(52) U.S. Cl.
CPC ............ *H05K 1/116* (2013.01); *H05K 1/113* (2013.01); *H05K 3/4644* (2013.01); *H05K 2201/09472* (2013.01)

(58) Field of Classification Search
CPC ......... H05K 1/116; H05K 2201/09472; H05K 2201/096; H05K 1/112–115; H05K 2201/0347; H05K 2201/0969; H05K 2201/09745; H05K 1/181
See application file for complete search history.

(56) References Cited

U.S. PATENT DOCUMENTS

| | | | | |
|---|---|---|---|---|
| 8,312,624 | B1* | 11/2012 | Chang | H05K 3/421 29/846 |
| 2010/0212947 | A1* | 8/2010 | Yamanaka | H05K 1/115 174/250 |
| 2010/0264549 | A1* | 10/2010 | Ko | H01L 21/486 438/666 |

(Continued)

FOREIGN PATENT DOCUMENTS

| | | |
|---|---|---|
| JP | H10-218675 A | 8/1998 |
| JP | 2002-76628 A | 3/2002 |

(Continued)

OTHER PUBLICATIONS

International Search Report for International Patent Application No. PCT/JP2020/039087 dated Dec. 22, 2020.

*Primary Examiner* — Steven T Sawyer
(74) *Attorney, Agent, or Firm* — Pearne & Gordon LLP

(57) ABSTRACT

A stacked-layer board includes a base material including a plurality of dielectric layers stacked on each other, a first main surface being a surface at one end in a stacking direction of the plurality of dielectric layers, and a second main surface being a surface at the other end in the stacking direction, and a first conductor provided on the first main surface, and a first groove is in a surface of the first conductor.

16 Claims, 10 Drawing Sheets

(56) References Cited

U.S. PATENT DOCUMENTS

| | | | | |
|---|---|---|---|---|
| 2011/0284277 A1* | 11/2011 | Kato | ................. | H05K 1/113 |
| | | | | 174/258 |
| 2011/0304059 A1* | 12/2011 | Kobayashi | ........... | H05K 3/3436 |
| | | | | 174/250 |
| 2014/0262442 A1* | 9/2014 | Nomura | ................. | H05K 1/113 |
| | | | | 427/97.8 |
| 2015/0034366 A1* | 2/2015 | Yoshioka | ............. | H05K 3/0079 |
| | | | | 174/251 |
| 2016/0100484 A1* | 4/2016 | Kunieda | ........... | H01L 23/49811 |
| | | | | 174/250 |

FOREIGN PATENT DOCUMENTS

| JP | 2002-118194 A | 4/2002 |
|---|---|---|
| JP | 2005-72558 A | 3/2005 |
| JP | 2008-4733 A | 1/2008 |
| JP | 4337129 B2 | 9/2009 |

\* cited by examiner

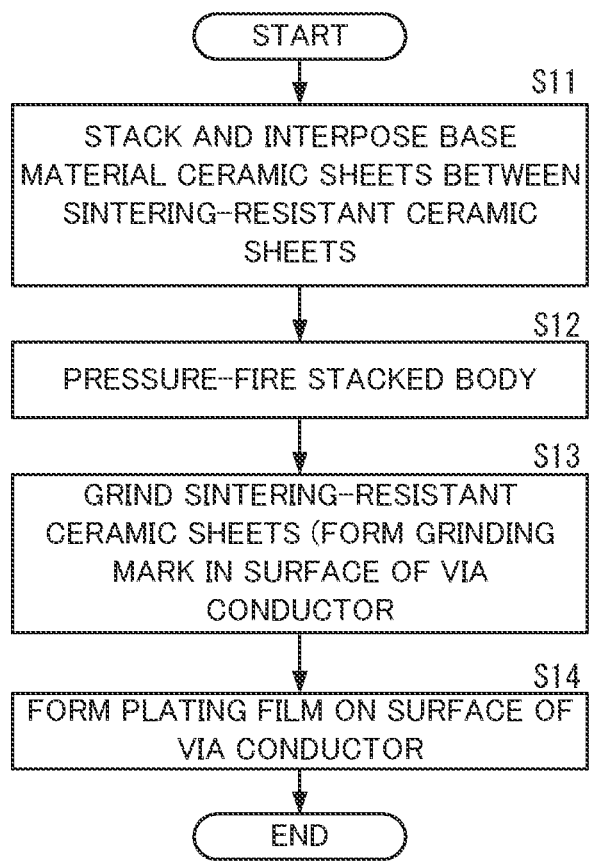

STACKED-LAYER BOARD, ELECTRONIC COMPONENT MODULE, AND METHOD OF MANUFACTURING STACKED-LAYER BOARD

CROSS REFERENCE TO RELATED APPLICATION

This is a continuation of International Application No. PCT/JP2020/039087 filed on Oct. 16, 2020 which claims priority from Japanese Patent Application No. 2019-196871 filed on Oct. 30, 2019. The contents of these applications are incorporated herein by reference in their entireties.

BACKGROUND OF THE DISCLOSURE

Field of the Disclosure

The present disclosure relates to a stacked-layer board including a mount electrode or a terminal electrode by use of a via conductor exposed to a surface.

Description of the Related Art

Patent Literature 1 discloses a technique for increasing flatness of a fired substrate when a low temperature co-fired ceramic substrate is pressure-fired. In Patent Literature 1, the low temperature co-fired ceramic substrate, while being interposed between restraint ceramic green sheets, is pressure-fired. The restraint ceramic green sheets, after being pressure-fired, are removed.

Patent Literature 1: Japanese Unexamined Patent Application Publication No. H10-218675

BRIEF SUMMARY OF THE DISCLOSURE

The above technique is also applicable to a stacked-layer board. The stacked-layer board is provided by stacking a plurality of dielectric layers and pressure-firing the plurality of dielectric layers after stacking. In such a case, in order to ensure flatness of the stacked-layer board, restraint ceramic green sheets such as sintering-resistant ceramic sheets are placed on both ends in a stacking direction and pressure-fired. As described above, pressure-fired restraint ceramic green sheets are removed.

However, it is difficult to completely remove the pressure-fired restraint ceramic green sheets. Therefore, with a configuration in which a via conductor is exposed to a surface of the stacked-layer board, a non-eliminable layer remains on the surface of the via conductor. As a result, platability of the surface of the via conductor may be deteriorated or reliability of connection between an electrode provided on the surface of the via conductor and the via conductor may be reduced.

Therefore, exemplary embodiments of the present disclosure provide a stacked-layer board capable of reducing a decrease in platability to a via conductor exposed to a surface and in reliability of connection of a via conductor to an electrode on a surface.

A stacked-layer board according to the present disclosure includes a base material and a first conductor. The base material includes a plurality of dielectric layers stacked on each other. A surface at one end in a stacking direction of the plurality of dielectric layers is a first main surface of the base material, and a surface at the other end in the stacking direction is a second main surface of the base material. The first conductor is provided on the first main surface. A first groove is in a surface of the first conductor.

With this configuration, the surface of the first conductor (a via conductor, for example) is ground to such an extent that a groove is provided, so that, even when impurities are attached on the surface of the first conductor, these impurities are removed. In addition, an area exposed to the surface of the first conductor, that is, an area in which plating and other electrodes are connected, is larger than an area in a state in which no groove is provided.

According to the present disclosure, a decrease in platability to a via conductor exposed to a surface and in reliability of connection of a via conductor to an electrode on a surface is able to be reduced.

BRIEF DESCRIPTION OF THE SEVERAL VIEWS OF THE DRAWINGS

FIG. 3 is a flow chart showing an example of a method of manufacturing the stacked-layer board according to the first exemplary embodiment of the present disclosure.

DETAILED DESCRIPTION OF THE DISCLOSURE

First Exemplary Embodiment

Figure 1A:
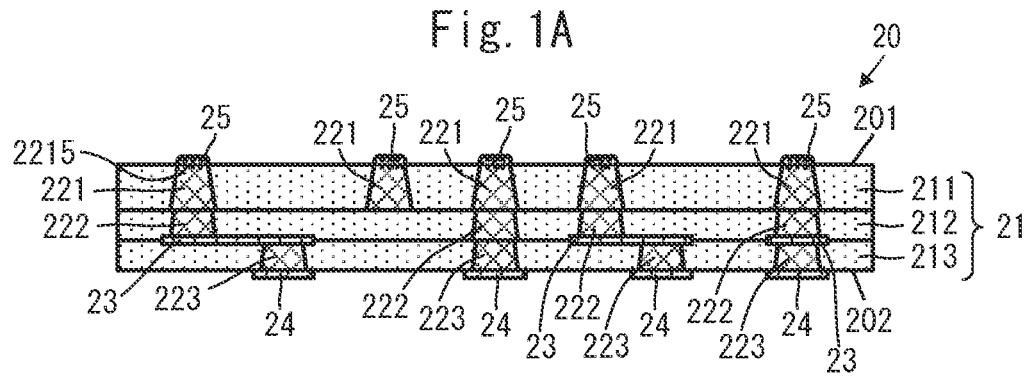
FIG. 1A is a side cross-sectional view showing a configuration of a stacked-layer board according to a first exemplary embodiment of the present disclosure.
Figure 1B:
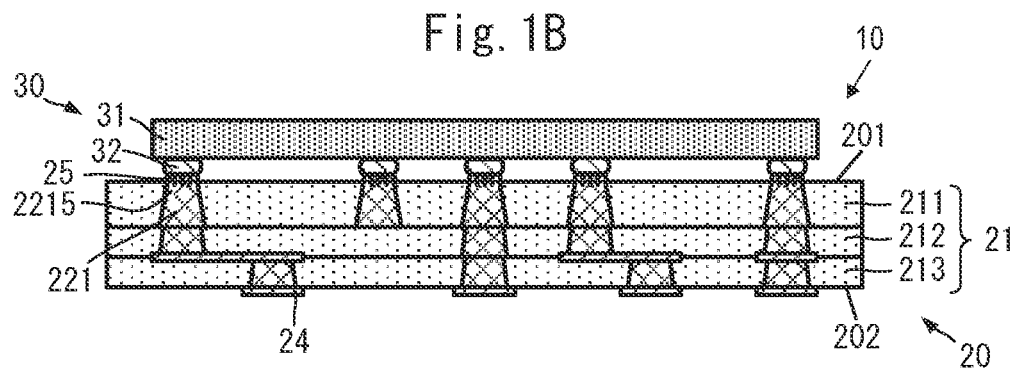
FIG. 1B is a side cross-sectional view showing a configuration of an electronic component module.

A stacked-layer board and an electronic component module according to a first exemplary embodiment of the present disclosure will be described with reference to drawings. FIG. 1A is a side cross-sectional view showing a configuration of the stacked-layer board according to the first exemplary embodiment of the present disclosure, and FIG. 1B is a side cross-sectional view showing a configuration of the electronic component module.

Configuration of Stacked-Layer Board 20

As shown in FIG. 1A, the stacked-layer board 20 includes a base material 21, a plurality of via conductors 221, 222, and 223, a plurality of wiring conductors 23, a plurality of terminal electrodes 24, and a plurality of plating films 25.

The base material 21 includes a dielectric layer 211, a dielectric layer 212, and a dielectric layer 213. The dielectric layer 211, the dielectric layer 212, and the dielectric layer 213 each have a flat plate shape or a flat film shape, and are stacked on each other in order in a direction perpendicular to a main surface of each dielectric layer. Therefore, the base material 21 is a stacked body obtained by stacking the dielectric layer 211, the dielectric layer 212, and the dielectric layer 213. An end surface near the dielectric layer 211 in the stacking direction of the plurality of dielectric layers 211, 212, and 213 is a first main surface 201 of the base material 21, and an end surface near the dielectric layer 213 in the stacking direction is a second main surface 202 of the base material 21. The dielectric layers 211, 212, and 213 are ceramics. It is to be noted that the dielectric layers 211, 212, and 213 may be a resin layer.

The plurality of via conductors 221 are provided on the dielectric layer 211, and are columnar conductors that penetrate the dielectric layer 211 in a thickness direction. The plurality of via conductors 221 are exposed to the first main surface 201. The plurality of via conductors 221 each correspond to the "first conductor" of the present disclosure. It is to be noted that the conductor exposed to the first main surface 201 is not limited to a via conductor and may be a conductor provided on the first main surface 201, for example.

A portion having a surface of the via conductor 221 exposed to the first main surface 201 and a predetermined thickness from the surface is a land portion 2211 of the via conductor 221. The land portion 2211 corresponds to a "first land portion" of the present disclosure.

The plurality of via conductors 222 are provided on the dielectric layer 212, and are columnar conductors that penetrate the dielectric layer 212 in the thickness direction.

The plurality of via conductors 223 are provided on the dielectric layer 213, and are columnar conductors that penetrate the dielectric layer 213 in the thickness direction. The plurality of via conductors 223 are exposed to the second main surface 202. The plurality of via conductors 223 each correspond to a "second conductor" of the present disclosure. It is to be noted that the conductor exposed to the second main surface 202 is not limited to a via conductor and may be a conductor provided on the second main surface 202, for example.

The plurality of wiring conductors 23 are linear or belt-like conductors, and are conductors extending in a direction perpendicular to the stacking direction. The plurality of wiring conductors 23 are provided inside the base material 21, and, in a case of FIG. 1A and FIG. 1B, are provided on a boundary surface between the dielectric layer 212 and the dielectric layer 213.

The plurality of via conductors 221, the plurality of via conductors 222, the plurality of via conductors 223, and the plurality of wiring conductors 23 are disposed in contact with the base material 21 so as to configure an electrical circuit obtained by the stacked-layer board 20.

The plurality of terminal electrodes 24 are rectangular electrodes, for example, and are provided on the second main surface 202. The plurality of terminal electrodes 24 are provided on a surface of the plurality of via conductors 223 near the second main surface 202.

The plurality of plating films 25 are provided on a surface of the plurality of via conductors 221 near the first main surface 201.

Configuration of Electronic Component Module 10

As shown in FIG. 1B, the electronic component module 10 includes a stacked-layer board 20 and an electronic component 30. The stacked-layer board 20 includes a configuration shown in FIG. 1A, as described above.

The electronic component 30 includes a component body 31 and a plurality of solder bumps 32. The component body 31 has a flat plate shape. The component body 31 includes a semiconductor substrate or a piezoelectric substrate, and has an electrical or electronic function. The plurality of solder bumps 32 are arranged on one main surface of the component body 31. The electronic component 30 corresponds to a "first electronic component" of the present disclosure.

The electronic component 30 is mounted on the first main surface 201 of the stacked-layer board 20. More specifically, the electronic component 30 is mounted on the stacked-layer board 20 when the plurality of solder bumps 32 electrically and physically connect to the plurality of plating films 25.

Specific Configuration of Land Portion 2211

Figure 2A:
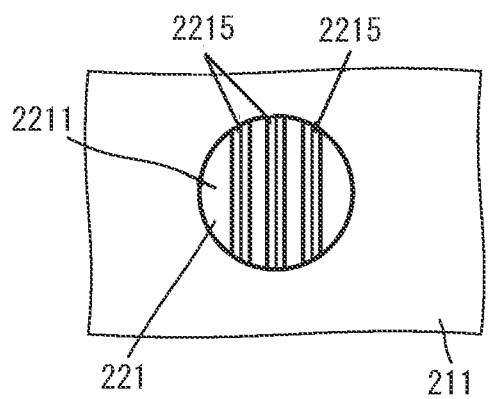
FIG. 2A and FIG. 2C are enlarged plan views of a portion including a surface of a via conductor in the stacked-layer board.
Figure 2C:
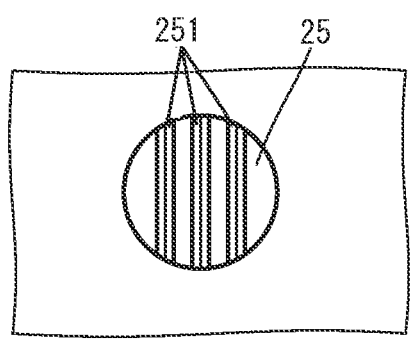
Figure 2B:
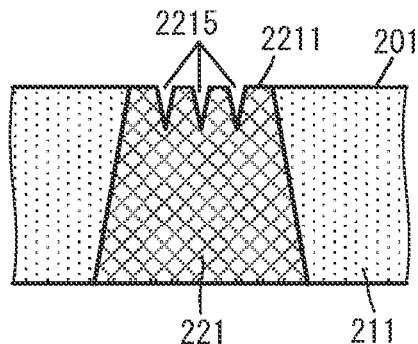
FIG. 2B and FIG. 2D are enlarged side cross-sectional views of the portion.
Figure 2D:
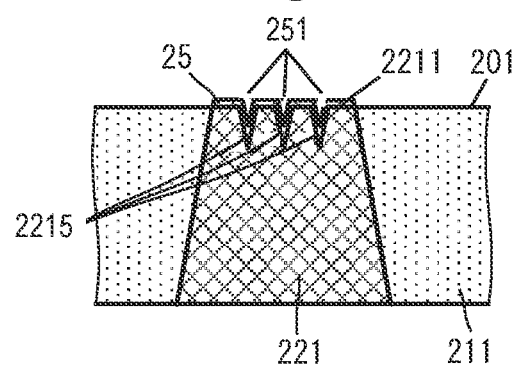

FIG. 2A and FIG. 2C are enlarged plan views of a portion including a surface of a via conductor in a stacked-layer board, and FIG. 2B and FIG. 2D are enlarged side cross-sectional views of the portion. FIG. 2A and FIG. 2B show a state in which a plating film is not provided, and FIG. 2C and FIG. 2D show a state in which a plating film is provided.

As shown in FIG. 2A and FIG. 2B, the land portion 2211 includes a plurality of grooves 2215. The plurality of grooves 2215 are provided in a predetermined depth from a surface (a surface of the via conductor 221 near the first main surface 201) of the land portion 2211. The depth may be about 1 μm to about 10 μm, for example. The plurality of grooves 2215 each correspond to a "first groove" of the present disclosure.

The plurality of grooves 2215 are provided so as to cross the land portion 2211. In other words, the plurality of grooves 2215 are provided so that two points of an outline that defines a surface of the land portion 2211 may be connected.

With such a configuration, an unwanted substance adhered to the surface (the surface of the via conductor 221 near the first main surface 201) of the land portion 2211 is shaved and removed when a groove 2215 is formed. As a result, cleanliness of the surface of the land portion 2211 is improved. The cleanliness herein is an indicator of the presence or absence of a substance that has an adverse effect on formation of a plating film 25 to be described below, and improved cleanliness means that substances that have an adverse effect are reduced. Then, high cleanliness means a few, almost no, or no substances that have an adverse effect.

As a result, the platability of the land portion 2211 is improved.

As shown in FIG. 2C and FIG. 2D, the plating film 25 is provided on the surface of the land portion 2211 that includes the plurality of grooves 2215. The plating film 25 is provided by Ni(nickel)/Au(gold) plating, for example. The plating film corresponds to a "first electrode film" of the present disclosure.

As described above, the high cleanliness of the surface of the land portion 2211 improves adhesiveness of the plating film 25 and the land portion 2211. In addition, no or almost no unwanted substances are between the plating film 25 and the land portion 2211. In other words, reliability of connection between the plating film 25 and the land portion 2211 improves. Furthermore, as shown in FIG. 2D, the plating film 25 is provided even inside the groove 2215, so that an area (a bonded area) of connection between the plating film 25 and the land portion 2211 is able to be larger than an area without the groove 2215. As a result, the reliability of connection between the plating film 25 and the land portion 2211 is further improved.

In addition, the thickness of the plating film 25 is adjusted, so that a plurality of depressions 251 may be able to be provided on the surface of the plating film 25. The plurality of depressions 251 each have a shape corresponding to a depression provided by the plurality of grooves 2215. As a result, a surface area of the plating film 25 is able to be increased. Accordingly, reliability of connection with the solder bump 32 of the electronic component 30 is improved. As a result, the reliability of connection between the stacked-layer board 20 and the electronic component 30 in the electronic component module 10 is improved.

Method of Manufacturing Stacked-Layer Board 20

Figure 4A:
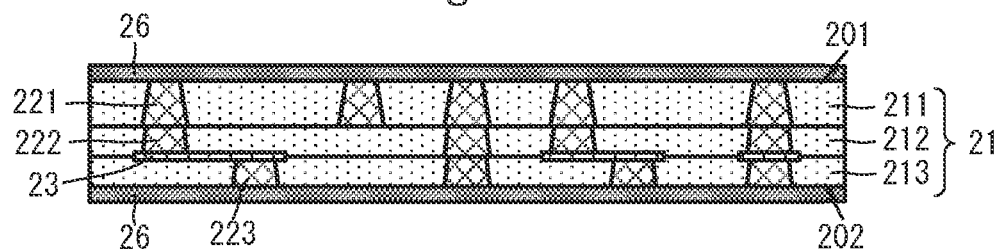
FIG. 4A, FIG. 4B, and FIG. 4C are side cross-sectional views showing a state in some steps of the method of manufacturing the stacked-layer board according to the first exemplary embodiment of the present disclosure.
Figure 4B:
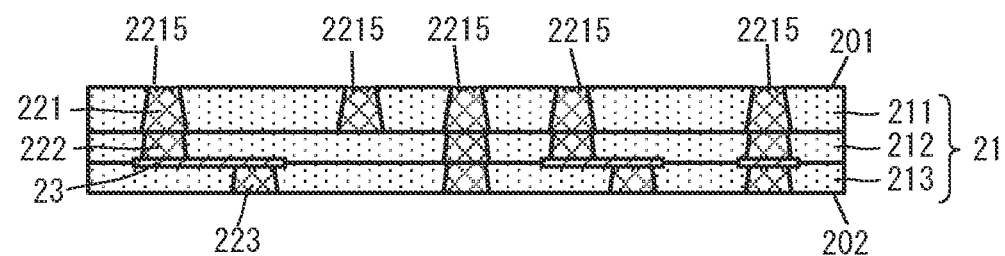
Figure 4C:
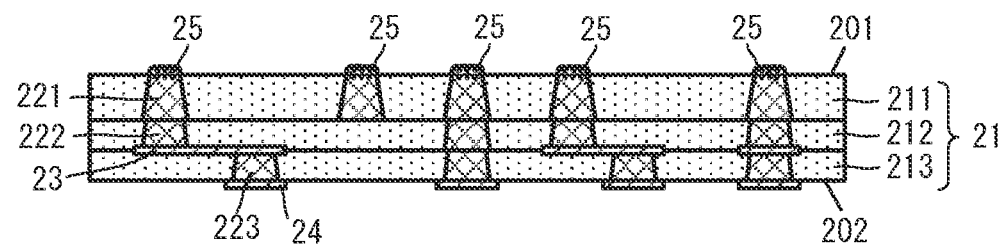
Figure 5A:
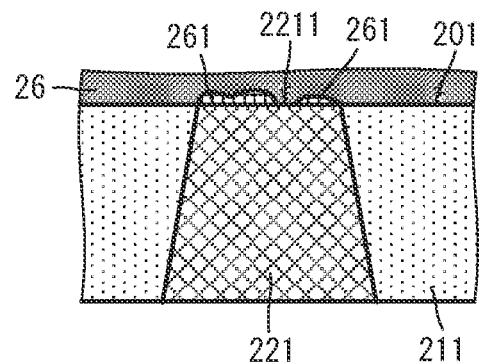
FIG. 5A, FIG. 5B, and FIG. 5C are side cross-sectional views showing a state in some steps of the method of manufacturing the stacked-layer board according to the first exemplary embodiment of the present disclosure.
Figure 5B:
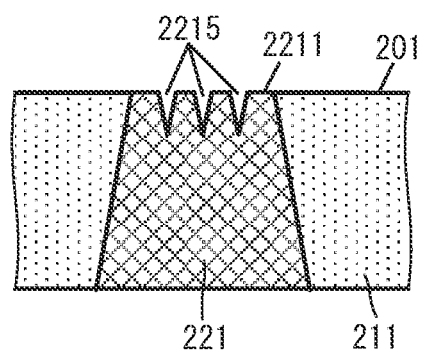
Figure 5C:
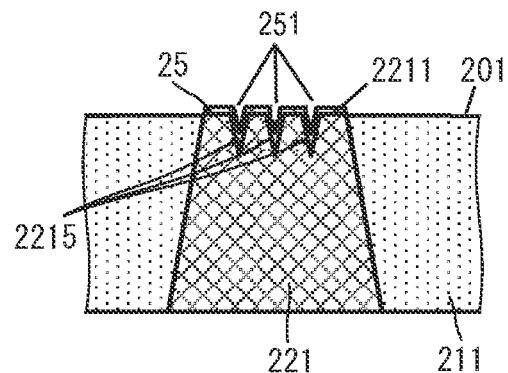

FIG. 3 is a flow chart showing an example of a method of manufacturing the stacked-layer board according to the first exemplary embodiment of the present disclosure. FIG. 4A, FIG. 4B, and FIG. 4C are side cross-sectional views showing a state in some steps of the method of manufacturing the stacked-layer board according to the first exemplary embodiment of the present disclosure. FIG. 5A, FIG. 5B, and FIG. 5C are side cross-sectional views showing a state in some steps of the method of manufacturing the stacked-layer board according to the first exemplary embodiment of the present disclosure.

First, as shown in FIG. 4A, base material ceramic sheets respectively configuring the plurality of dielectric layers 211, 212, and 213 are stacked on each other. Furthermore, as shown in FIG. 4A and FIG. 5A, sintering-resistant ceramic sheets 26 are stacked so as to interpose the plurality of base material ceramic sheets (S11). The sintering-resistant ceramic sheets 26 are made of a material having a higher sintering temperature than the base material ceramic sheet, for example, and are made of a material containing alumina, for example.

Next, a stacked body including the plurality of base material ceramic sheets and the sintering-resistant ceramic sheets 26 is pressure-fired according to a firing temperature of the base material ceramic sheets (S12). Such pressure-firing is able to form the base material 21 while reducing deformation of the base material ceramic sheets. As a result, the base material 21 with high flatness is able to be manufactured. Furthermore, stacking and interposing between not-shown restraint insulator layers and pressure-firing are able to obtain much higher flatness.

Subsequently, the sintering-resistant ceramic sheets 26 are ground from the pressure-fired stacked body (S13). Examples of grinding include plane polishing in which a stacked body is ground while a grinding stone is rotated and lapping processing in which polishing is gradually performed while an abrasive agent containing free abrasive grain is poured and rubbed.

The grinding is performed in this manner, as shown in FIG. 5B, so that the sintering-resistant ceramic sheets 26 are removed and the base material 21 including the dielectric layers 211, 212, and 213 is formed. In such a case, polishing conditions such as roughness of polishing, an amount of polishing, and intensity of polishing near the first main surface 201 are adjusted, so that the plurality of grooves 2215 defined by grinding marks are formed in a surface (an exposed surface) of the via conductor 221 near the first main surface 201, as shown in FIG. 4C and FIG. 5B.

Then, the grinding (polishing) is performed to the extent that the plurality of grooves 2215 are provided in this manner, so that an unwanted substance (an alumina reaction layer, for example) on the surface of the via conductor 221 is able to be more reliably removed. As a result, cleanliness of the surface of the via conductor 221 is improved.

In such a case, hardness of the via conductor 221 is low as compared with the dielectric layer 211. Therefore, it is possible to form the plurality of grooves 2215 defined by grinding marks in the surface of the via conductor 221 without leaving almost any grinding marks on the dielectric layer 211. As a result, a decrease in the reliability of the base material 21 is able to be reduced.

Subsequently, as shown in FIG. 5C, the plating film 25 is formed on the surface of the via conductor 221 (S14). Herein, according to the above step, the unwanted substance on the surface of the via conductor 221 is removed, so that the adhesiveness between the via conductor 221 and the plating film is improved, and the connection reliability is improved. Furthermore, as shown in FIG. 5C, the plating film 25 is formed so as to enter into the groove 2215, so that an area of connection between the plating film 25 and the via conductor 221 is larger than an area without the groove 2215. Therefore, the reliability of connection between the via conductor 221 and the plating film 25 is further improved.

In such a manner, by using the manufacturing method of the present exemplary embodiment, in the step of forming the base material 21 with high flatness, the groove 2215 is able to be easily formed by use of the grinding of the sintering-resistant ceramic sheet. In other words, the base material 21 with good platability of the surface of the via conductor 221 is able to be formed without using complex manufacturing steps.

It is to be noted that, although not described in detail, a terminal electrode 24 is formed on a surface (an exposed surface) of the via conductor 223 near the second main surface 202 by screen printing or the like and firing. In such a case, although not shown, a groove is also able to be formed in the surface of the via conductor 223 near the second main surface 202 by polishing similar to the polishing performed on the first main surface 201. Then, this groove is formed, so that the reliability of connection between the terminal electrode 24 and the via conductor 223 as well as between the via conductor 221 and the plating film 25 is able to be improved.

Second Exemplary Embodiment

Figure 6A:
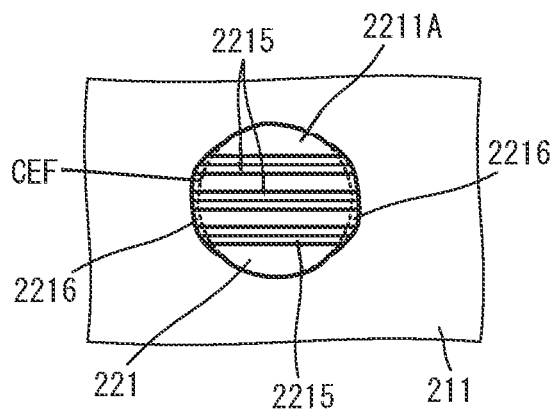
FIG. 6A and FIG. 6C are enlarged plan views of a portion including a surface of a via conductor in a stacked-layer board according to a second exemplary embodiment of the present disclosure.
Figure 6C:
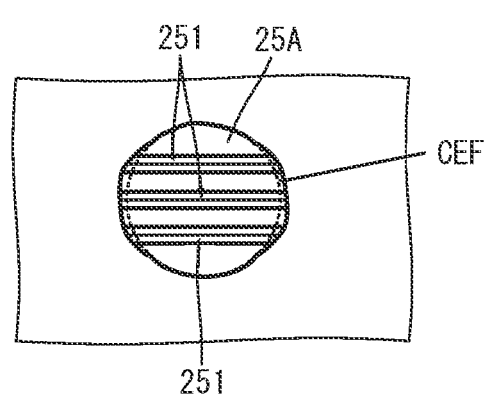
Figure 6B:
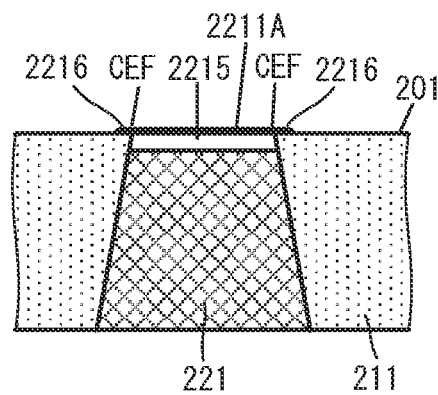
FIG. 6B and FIG. 6D are enlarged side cross-sectional views of the portion.
Figure 6D:
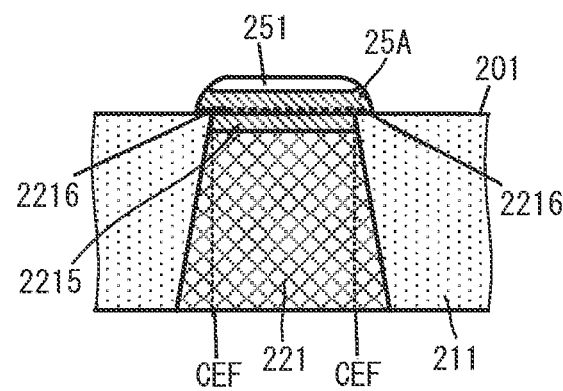

A stacked-layer board according to a second exemplary embodiment of the present disclosure will be described with reference to the drawings. FIG. 6A and FIG. 6C are enlarged plan views of a portion including a surface of a via conductor in a stacked-layer board according to the second exemplary embodiment of the present disclosure, and FIG. 6B and FIG. 6D are enlarged side cross-sectional views of the portion. FIG. 6A and FIG. 6B show a state in which a plating film is not provided, and FIG. 6C and FIG. 6D show a state in which a plating film is formed.

As shown in FIG. 6A, FIG. 6B, FIG. 6C, and FIG. 6D, the stacked-layer board according to the second exemplary embodiment is different in a shape of a land portion 2211A from the stacked-layer board 20 according to the first exemplary embodiment. Other configurations of the stacked-layer board according to the second exemplary embodiment are the same as or similar to the configurations of the stacked-layer board 20 according to the first exemplary embodiment, and a description of the same or similar configurations will be omitted.

As shown in FIG. 6A and FIG. 6B, the land portion 2211A includes a protrusion 2216 protruding outside from an outline CEF of a surface of the via conductor 221 near the first main surface 201. With this configuration, an area of the land portion 2211A is larger than an area of the surface of the via conductor 221 near the first main surface 201.

As shown in FIG. 6C and FIG. 6D, the plating film 25A is provided so as to cover the entirety of the surface of the land portion 2211A.

With such a configuration, the area of the land portion 2211A is able to be increased. As a result, the reliability of connection with the plating film 25A is further improved. In addition, in connection with this, the area of the plating film 25A also becomes large. As a result, the bonded area between the plating film 25A and not-shown solder bump 32 of the electronic component 30 is able to be increased, and the reliability of connection between the electronic component 30 and the stacked-layer board is further improved.

Such a protrusion 2216 is able to be obtained by dragging and extending the surface of the via conductor 221, in the grinding shown in the above first exemplary embodiment, for example. In other words, the protrusion 2216 is able to be easily formed by use of the manufacturing method shown in the first exemplary embodiment.

Third Exemplary Embodiment

Figure 7A:
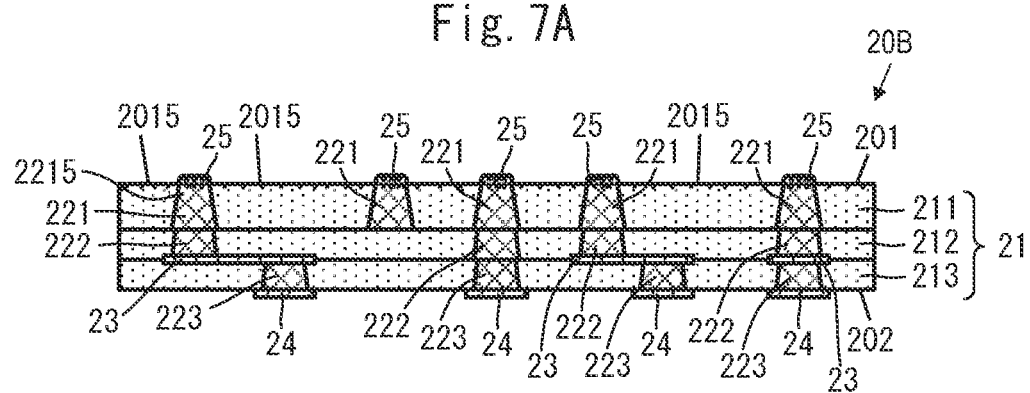
FIG. 7A is a side cross-sectional view showing a configuration of a stacked-layer board according to a third exemplary embodiment of the present disclosure.
Figure 7B:
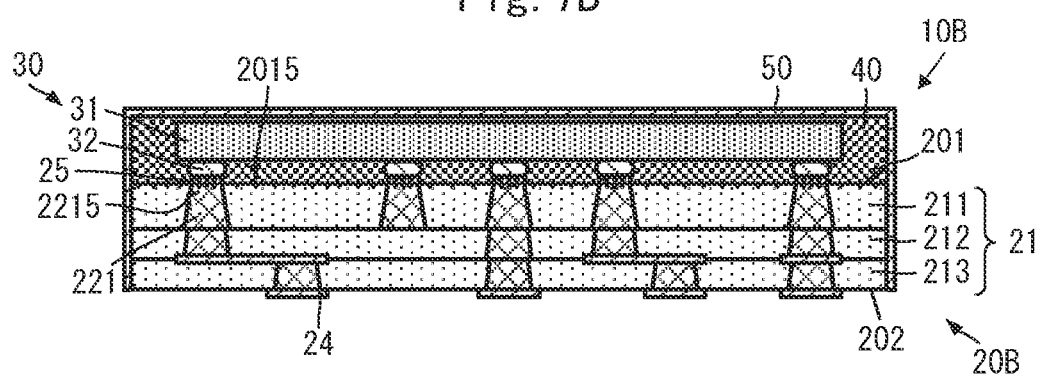
FIG. 7B is a side cross-sectional view showing a configuration of an electronic component module.
Figure 8:
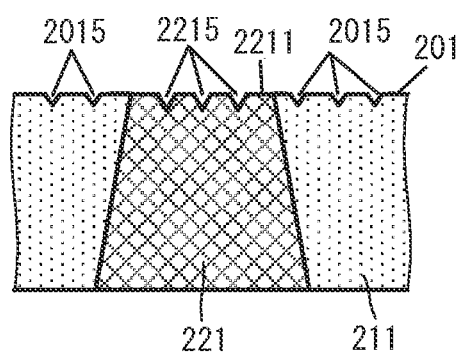
FIG. 8 is an enlarged side cross-sectional view of a portion including a surface of a via conductor in the stacked-layer board according to the third exemplary embodiment.

A stacked-layer board and an electronic component module according to a third exemplary embodiment of the present disclosure will be described with reference to the drawings. FIG. 7A is a side cross-sectional view showing a configuration of a stacked-layer board according to a third exemplary embodiment of the present disclosure, and FIG. 7B is a side cross-sectional view showing a configuration of an electronic component module. FIG. 8 is an enlarged side cross-sectional view of a portion including a surface of a via conductor in the stacked-layer board according to the third exemplary embodiment.

As shown in FIG. 7A, FIG. 7B, and FIG. 8, a stacked-layer board 20B according to the third exemplary embodiment is different from the stacked-layer board 20 according to the first exemplary embodiment in that a plurality of base material grooves 2015 are provided. Other configurations of the stacked-layer board 20B according to the third exemplary embodiment are the same as or similar to the configurations of the stacked-layer board 20 according to the first exemplary embodiment, and a description of the same or similar configurations will be omitted.

The stacked-layer board 20B includes a plurality of base material grooves 2015 in a first main surface 201 of the base material 21. The plurality of base material grooves 2015, as shown in FIG. 7A, FIG. 7B, and FIG. 8, are formed in a predetermined depth from the first main surface 201 of the base material 21. The plurality of base material grooves 2015 may be formed over substantially the entirety of the first main surface 201. However, the plurality of base material grooves 2015 may be formed in at least a region of the first main surface 201 that faces the electronic component 30.

The plurality of base material grooves 2015 are able to be formed in the same grinding step as the step of forming the groove 2215 in the surface (the land portion 2211) of the via conductor 221. In other words, an adjustment based on grinding conditions of the grinding step is able to form not only the groove 2215 in the surface of the via conductor 221 but also the base material grooves 2015 in the first main surface 201 of the base material 21. In such a manner, the base material grooves 2015 are able to be easily formed in addition to the groove 2215 to the via conductor 221. The plurality of base material grooves 2015 each correspond to a "first base material groove" of the present disclosure.

An electronic component module 10B includes a stacked-layer board 20B, an electronic component 30, an insulating resin layer 40, and a shield film 50. It is to be noted that the shield film 50 is able to be omitted.

The electronic component 30 is mounted near the first main surface 201 of the stacked-layer board 20B. The insulating resin layer 40 covers the electronic component 30 while covering the first main surface 201 of the stacked-layer board 20B. The shield film 50 has conductivity. The shield film 50 covers the outer surface of the insulating resin layer 40, and the side surfaces of the stacked-layer board 20B. The insulating resin layer 40 corresponds to a "first insulating resin layer" of the present disclosure.

In such a configuration, the insulating resin layer 40 is formed by applying a fluid resin on a side of the first main surface 201 of the stacked-layer board 20B, and curing the fluid resin. In such a case, the plurality of base material grooves 2015 contribute to pouring the fluid resin between the stacked-layer board 20B and the electronic component 30 due to capillary action. In other words, the fluid resin is able to easily enter between the stacked-layer board 20B and the electronic component 30 by the plurality of base material grooves 2015.

Accordingly, the fluid resin is sufficiently filled between the stacked-layer board 20B and the electronic component 30. Therefore, the insulating resin layer 40 is formed so as to fully spread over the entire space between the stacked-layer board 20B and the electronic component 30. As a result, the occurrence of solder splash and other defects caused by the solder bump 32 during reflow of other circuit boards on which the electronic component module 10 is mounted is able to be prevented, and the reliability of the electronic component module 10B is improved.

In particular, in a case of forming the electronic component module 10 of which the height is reduced, a distance between the first main surface 201 of the stacked-layer board 20B and the electronic component 30 is easily reduced. In such a case as well, with the configuration of the stacked-layer board 20B, the insulating resin layer 40 is formed so as to fully spread over the entire space between the stacked-layer board 20B and the electronic component 30. Therefore, the reliability of the electronic component module 10B is further improved.

Fourth Exemplary Embodiment

Figure 9A:
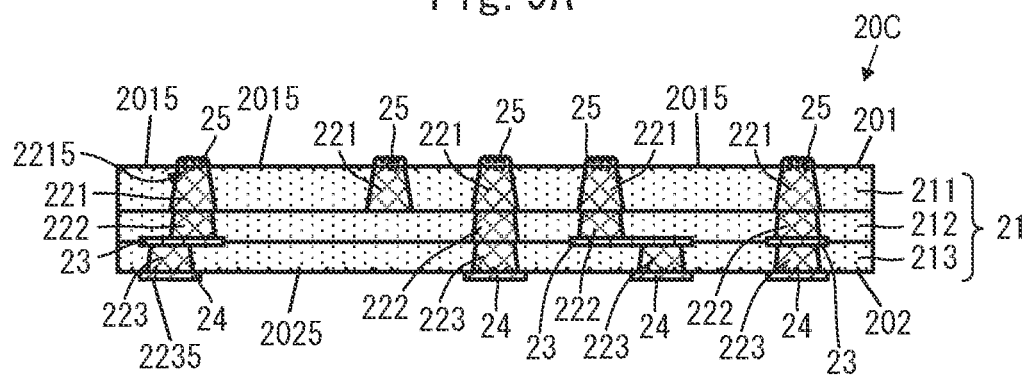
FIG. 9A is a side cross-sectional view showing a configuration of a stacked-layer board according to a fourth exemplary embodiment of the present disclosure.

A stacked-layer board and an electronic component module according to a fourth exemplary embodiment of the present disclosure will be described with reference to drawings. FIG. 9A is a side cross-sectional view showing a configuration of a stacked-layer board according to the fourth exemplary embodiment of the present disclosure, and FIG. 9B is a side cross-sectional view showing a configuration of an electronic component module.

Figure 9B:
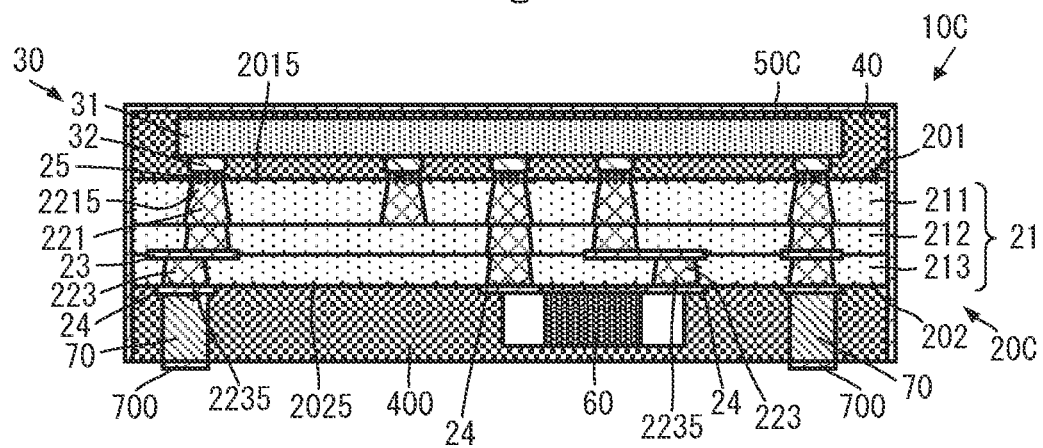
FIG. 9B is a side cross-sectional view showing a configuration of an electronic component module.

As shown in FIG. 9A and FIG. 9B, a stacked-layer board 20C according to the fourth exemplary embodiment is different from the stacked-layer board 20B according to the third exemplary embodiment in that a groove 2235 and a base material groove 2025 are provided. Other configurations of the stacked-layer board 20C according to the fourth exemplary embodiment are the same as or similar to the configurations of the stacked-layer board 20B according to the third exemplary embodiment, and a description of the same or similar configurations will be omitted.

The stacked-layer board 20C includes a plurality of grooves 2235 in a surface of the via conductor 223 near the second main surface 202. The plurality of via conductors 223 each correspond to a "second via conductor" of the present disclosure, and a portion having the surface of the via conductor 223 near the second main surface 202 and a predetermined depth from the surface corresponds to a "second land portion" of the present disclosure. The groove 2235 includes the same structure as the groove 2215.

The terminal electrode 24 has a shape with a portion that faces the surface of the via conductor 223 including the plurality of grooves 2235, near the second main surface 202. The terminal electrode 24 corresponds to a "second electrode film" of the present disclosure. Then, with the plurality of grooves 2235 on the surface of the via conductor 223 near the second main surface 202, the reliability of connection between the via conductor 223 and the terminal electrode 24 is improved in the same way as the reliability of connection between the via conductor 221 and the plating film 25 is improved. At this time, an increase in the thickness of the terminal electrode 24 is able to flatten a surface (one surface opposite to the other surface connected to the via conductor 223) of the terminal electrode 24.

In addition, the stacked-layer board 20C includes a plurality of base material grooves 2025 in the second main surface 202. The plurality of base material grooves 2025 each correspond to a "second base material groove" of the present disclosure. The plurality of base material grooves 2025 include the same structure as the plurality of base material grooves 2015.

As shown in FIG. 9B, an electronic component module 10C is different from the electronic component module 10B in that an insulating resin layer 400, an electronic component 60, a columnar conductor 70, and an external terminal electrode 700 are provided. Other configurations of the electronic component module 10C are the same as or similar to the configurations of the electronic component module 10B, and a description of the same or similar configuration will be omitted.

The electronic component 60 and the columnar conductor 70 are mounted near the second main surface 202 of the stacked-layer board 20C. More specifically, the electronic component 60 and the columnar conductor 70 are bonded to the plurality of terminal electrodes 24 of the stacked-layer board 20C, respectively. The electronic component 60 corresponds to a "second electronic component" of the present disclosure.

The insulating resin layer 400 covers the second main surface 202 of the stacked-layer board 20C, the electronic component 60, and the side surface of the columnar conductor 70. The insulating resin layer 400 corresponds to a "second insulating resin layer" of the present disclosure.

The external terminal electrode 700 is provided on one end surface of the columnar conductor 70 opposite to the other end surface connected to the terminal electrode 24. The shield film 50C covers the outer surface of the insulating resin layer 40, the side surface of the base material 21, and the side surface of the insulating resin layer 400.

With such a configuration, while the same advantageous functions and effects as the advantageous functions and effects in the above exemplary embodiments are obtained, the bonding strength between the insulating resin layer 400 and the base material 21 is improved, and the reliability of the electronic component module 10C is improved. In other words, the reliability of the double-sided mount electronic component module 10C is able to be improved.

Other Configuration Examples of Groove

Figure 10A:
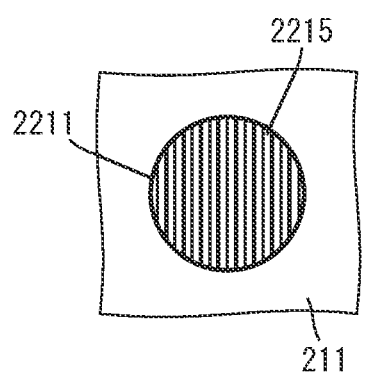
FIG. 10A and FIG. 10B are partial enlarged plan views showing an example of a groove to be provided in a surface (a land portion) of a via conductor.
Figure 10B:
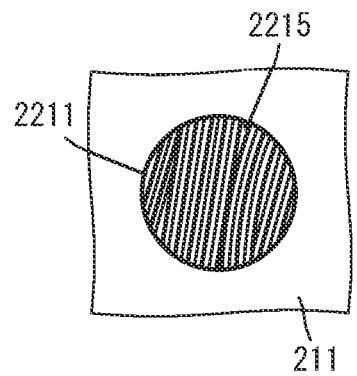

FIG. 10A and FIG. 10B are partial enlarged plan views showing an example of a groove to be provided in a surface (a land portion) of a via conductor.

In an example shown in FIG. 10A, the plurality of grooves 2215 are provided over the entire surface of the land portion 2211. In an example shown in FIG. 10B, the plurality of grooves 2215 have different traces.

In such a manner, the plurality of grooves 2215 may be partially or entirely provided in the land portion 2211. In particular, when the plurality of grooves 2215 are provided over the entire surface of the land portion 2211, the platability of the surface of the via conductor 221 and the reliability of connection of the via conductor 221 to other electrodes are further improved.

It is to be noted that the above description shows that almost all the grooves 2215 cross the land portion 2211. However, even when the groove 2215 has a shape that does not completely cross the land portion 2211, it is possible to obtain the advantageous functions and effects of the present disclosure. Moreover, when the groove 2215 has a shape that crosses the land portion 2211, the platability of the surface of the via conductor 221 and the reliability of connection of the via conductor 221 to other electrodes are much more improved. In addition, even at least one groove 2215 is able to obtain at least the advantageous functions and effects of the present disclosure.

In addition, the configuration of each of the above exemplary embodiments is able to be appropriately combined, and advantageous functions and effects according to each combination are able to be obtained. In other words, the first and second exemplary embodiments may also be configured to include a mount component, an insulating resin layer that covers the mount component, and a shield film. Furthermore, the first and second exemplary embodiments may also be configured to include a mount component near the second main surface, an insulating resin layer that covers the mount component, and a shield film.

10, 10B, 10C: electronic component module
20, 20B, 20C: stacked-layer board
21: base material
23: wiring Conductor
24: terminal electrode
25, 25A: plating film
26: sintering-resistant ceramic sheet
30: electronic component
31: component body
32: solder bump
40, 400: insulating resin layer 50, 50C: shield film
60: electronic component
70: columnar conductor
201: first main surface
202: second main surface
211, 212, 213: dielectric layer
221, 222, 223: via conductor
251: depression
700: external terminal electrode
2015, 2025: base material groove
2211, 2211A: land portion
2215, 2235: groove

The invention claimed is:

1. A stacked-layer board comprising: a base material including: a plurality of dielectric layers stacked on each other; a first main surface being a surface at one end in a stacking direction of the plurality of dielectric layers; and a second main surface being a surface at another end in the stacking direction; a first conductor provided on the first main surface, wherein a first groove is in a surface of the first conductor; and a first base material groove provided in the first main surface; and a first land portion provided on the surface of the first conductor, wherein the first base material groove and the first conductor are formed at different positions on the first main surface, and wherein the first land portion extends beyond the surface of the first conductor only in a direction parallel to an extension direction of the first base material groove.

2. The stacked-layer board according to claim 1, wherein the first groove has a shape crossing the surface of the first conductor.

3. The stacked-layer board according to claim 1, wherein the first groove is provided in an entirety of the surface of the first conductor.

4. The stacked-layer board according to claim 1, wherein the first conductor is a via conductor exposed from the first main surface.

5. The stacked-layer board according to claim 1, further comprising a first electrode film provided on the surface of the first conductor.

6. The stacked-layer board according to claim 5, wherein the first electrode film includes a depression having a shape corresponding to the first groove.

7. An electronic component module comprising:
the stacked-layer board according to claim 6; and
a first electronic component to be mounted on the first electrode film.

8. An electronic component module comprising:
the stacked-layer board according to claim 1;
a first electronic component to be mounted near the first main surface of the stacked-layer board; and
a first insulating resin layer covering the first main surface and the first electronic component.

9. The electronic component module according to claim 7, further comprising:
a second conductor provided on the second main surface;
a second electrode film provided on a surface of the second conductor; and
a second electronic component to be mounted on the second electrode film.

10. The electronic component module according to claim 9, wherein the second conductor is a via conductor exposed from the second main surface.

11. The electronic component module according to claim 9, further comprising:
a second base material groove provided in the second main surface; and
a second insulating resin layer covering the second main surface and the second electronic component.

12. A method of manufacturing the stacked-layer board according to claim 1, comprising:
a stacking step of stacking the plurality of dielectric layers interposed between restraint insulator layers;
a firing step of pressure-firing the plurality of dielectric layers interposed between the restraint insulator layers; and
a grinding step of grinding the pressure-fired restraint insulator layers and exposing the first main surface and the second main surface of the base material including the plurality of dielectric layers, wherein the grinding step performs the grinding so that a grinding mark may be generated in the surface of the first conductor provided on the first main surface of the base material.

13. The stacked-layer board according to claim 2, wherein the first groove is provided in an entirety of the surface of the first conductor.

14. The stacked-layer board according to claim 2, wherein the first conductor is a via conductor exposed from the first main surface.

15. The stacked-layer board according to claim 3, wherein the first conductor is a via conductor exposed from the first main surface.

16. The stacked-layer board according to claim 1, wherein the first base material groove is formed in a region of the first main surface that faces an electronic component mounted on the first main surface.

* * * * *